(12) United States Patent
Varrichione et al.

(10) Patent No.: US 8,422,324 B2
(45) Date of Patent: Apr. 16, 2013

(54) METHOD AND APPARATUS FOR SENDING TEST MODE SIGNALS

(75) Inventors: Jason Timothy Varrichione, Williston, VT (US); Prabir Kumar Majumdar, South Burlington, VT (US); Dave Eugene Chapman, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 130 days.

(21) Appl. No.: 13/218,461

(22) Filed: Aug. 26, 2011

(65) Prior Publication Data
US 2013/0051168 A1    Feb. 28, 2013

(51) Int. Cl.
*G11C 7/00*    (2006.01)

(52) U.S. Cl.
USPC ...................... 365/201; 365/189.02

(58) Field of Classification Search .................. 365/201, 365/189.02, 230.02
See application file for complete search history.

(56) References Cited

U.S. PATENT DOCUMENTS

| | | | | |
|---|---|---|---|---|
| 6,459,638 | B1 * | 10/2002 | Wu et al. | 365/201 |
| 6,529,430 | B2 * | 3/2003 | Wu et al. | 365/201 |
| 7,948,912 | B2 * | 5/2011 | Nakamura | 370/252 |

* cited by examiner

*Primary Examiner* — Son Dinh
(74) *Attorney, Agent, or Firm* — Winston Hsu; Scott Margo

(57) ABSTRACT

A test mode signal system includes: a test mode block for generating a plurality, N, of test mode signals; a test mode send block, for generating and outputting a pulsed signal according to a command signal, and for multiplexing the N test mode signals in sets according to the pulsed signal and outputting the multiplexed pairs of test mode signals over M signal wires wherein M is less than N, such that each signal wire carries a multiplexed set of the N test mode signals; and a test mode receive block, for receiving the multiplexed sets of N test mode signals and the pulsed signal and demultiplexing each multiplexed set of N test mode signals according to the pulsed signal.

16 Claims, 7 Drawing Sheets

US 8,422,324 B2

METHOD AND APPARATUS FOR SENDING TEST MODE SIGNALS

BACKGROUND OF THE INVENTION

1. Field of the Invention

The invention relates to memory devices and, more particularly, to memory devices having a reduced number of wires for test mode signals.

2. Description of the Prior Art

Typically, various test mode signals are generated for testing the integrity of individual circuits of a memory device during initialization or after resetting of the device. The test mode signals are generated by a test mode (TM) block, wherein a memory device may have a single or many TM blocks. Regardless of the number of TM blocks, these blocks are usually situated near the centre of the chip, thereby enabling the test mode signals to be easily routed to all circuits on the device. As the number of circuits within a memory device increases, the routing becomes more complex. Moreover, it further complicates the routing issue with the reduction in size of a semiconductor device.

SUMMARY OF THE INVENTION

A test mode signal system comprises: a test mode block for generating a plurality, N, of test mode signals; a test mode send block, for generating and outputting a pulsed signal according to a command signal, and for multiplexing the N test mode signals in sets according to the pulsed signal and outputting the multiplexed pairs of test mode signals over M signal wires wherein M is less than N, such that each signal wire carries a multiplexed set of the N test mode signals; and a test mode receive block, for receiving the multiplexed sets of N test mode signals and the pulsed signal and demultiplexing each multiplexed set of N test mode signals according to the pulsed signal.

A method for sending test mode signals comprises: receiving a command signal; generating and outputting a pulsed signal according to the command signal; generating a plurality, N, of test mode signals; multiplexing the N test mode signals in sets according to the pulsed signal; outputting the multiplexed sets of test mode signals over M signal wires wherein M is less than N, such that each signal wire carries a multiplexed set of the N test mode signals; receiving the multiplexed sets of N test mode signals and the pulsed signal; and demultiplexing each multiplexed set of N test mode signals according to the pulsed signal.

These and other objectives of the present invention will no doubt become obvious to those of ordinary skill in the art after reading the following detailed description of the preferred embodiment that is illustrated in the various figures and drawings.

DETAILED DESCRIPTION

In order to solve the problems associated with the prior art, the present invention provides a method and apparatus that can reduce the number of wires carrying test mode signals, by carrying more than one test mode signal on each individual wire.

Figure 1:
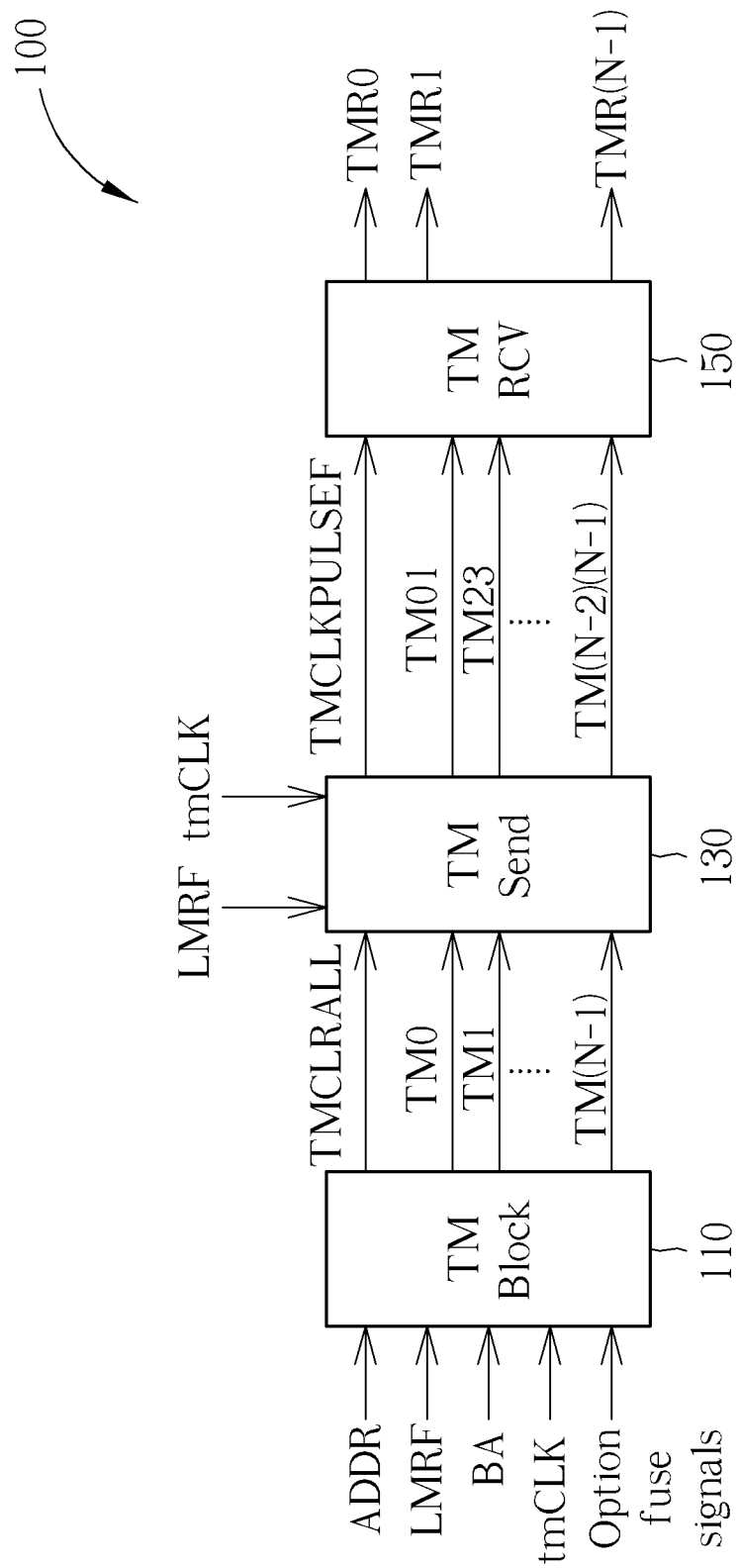
FIG. 1 is a block diagram of a test mode system in a memory device according to an exemplary embodiment of the present invention.

Please refer to FIG. 1, which shows a Test Mode system 100 inside a memory device (not illustrated), according to an exemplary embodiment of the present invention. The Test Mode system 100 comprises a Test Mode (TM) block 110 for generating test mode signals and sending the test mode signals to a TM send block 130. In FIG. 1 the TM block 110 and TM send block 130 are shown as separate blocks, but in an alternative embodiment the TM send block 130 may be located inside the TM block 110. The TM send block 130 is further coupled to a TM RCV block 150, for receiving the test mode signals. Only one TM RCV block is shown here for simplicity, but the TM block 110 and TM send block 130 may send test mode signals to a plurality of TM RCV blocks, located in different regions of the memory device. Furthermore, as described above, the memory device may have many TM blocks, but only a single set of circuits is shown in FIG. 1 for simplicity. The memory device may be a DRAM, SRAM, MRAM etc. and with suitable modifications the present invention can also be applied to logic devices.

Figure 2:
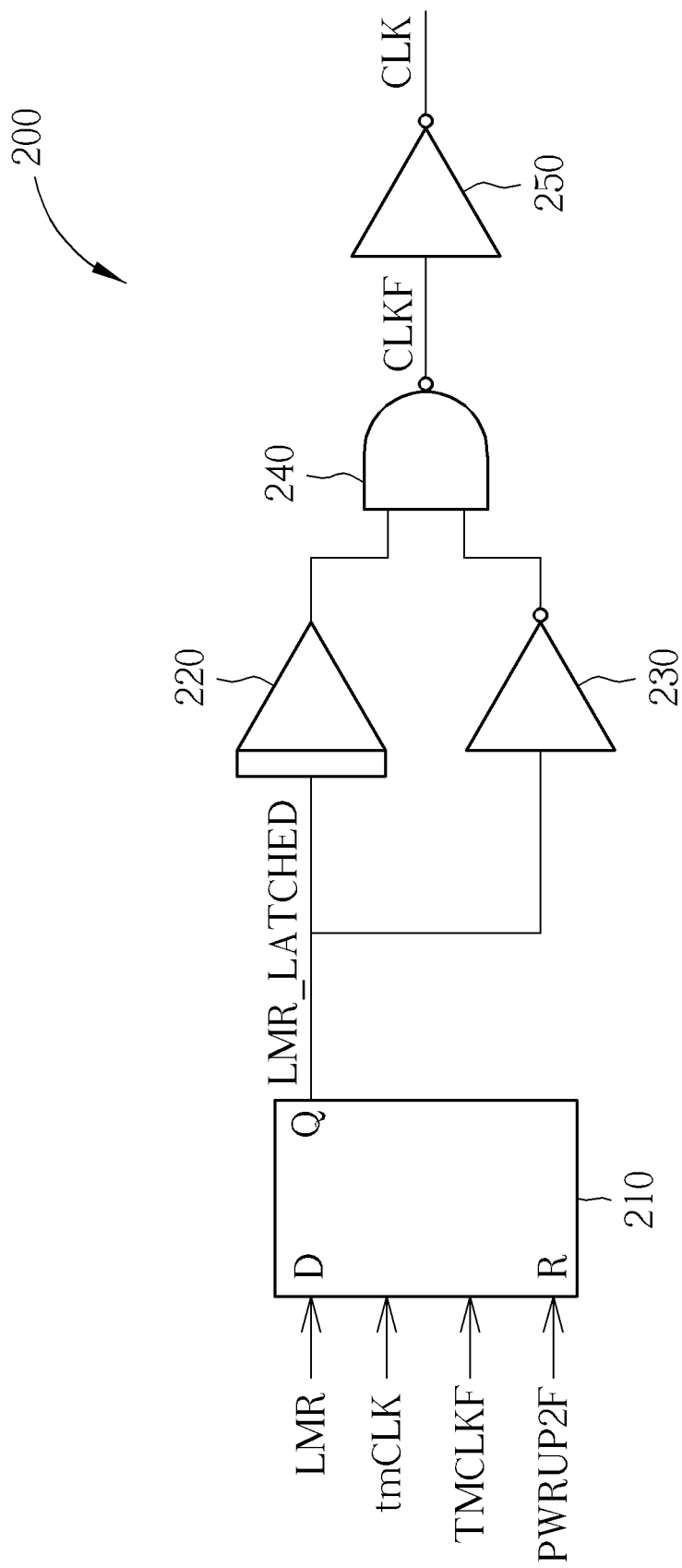
FIGS. 2-4 are schematics of the internal circuitry of the TM send block shown in FIG. 1.
Figure 3:
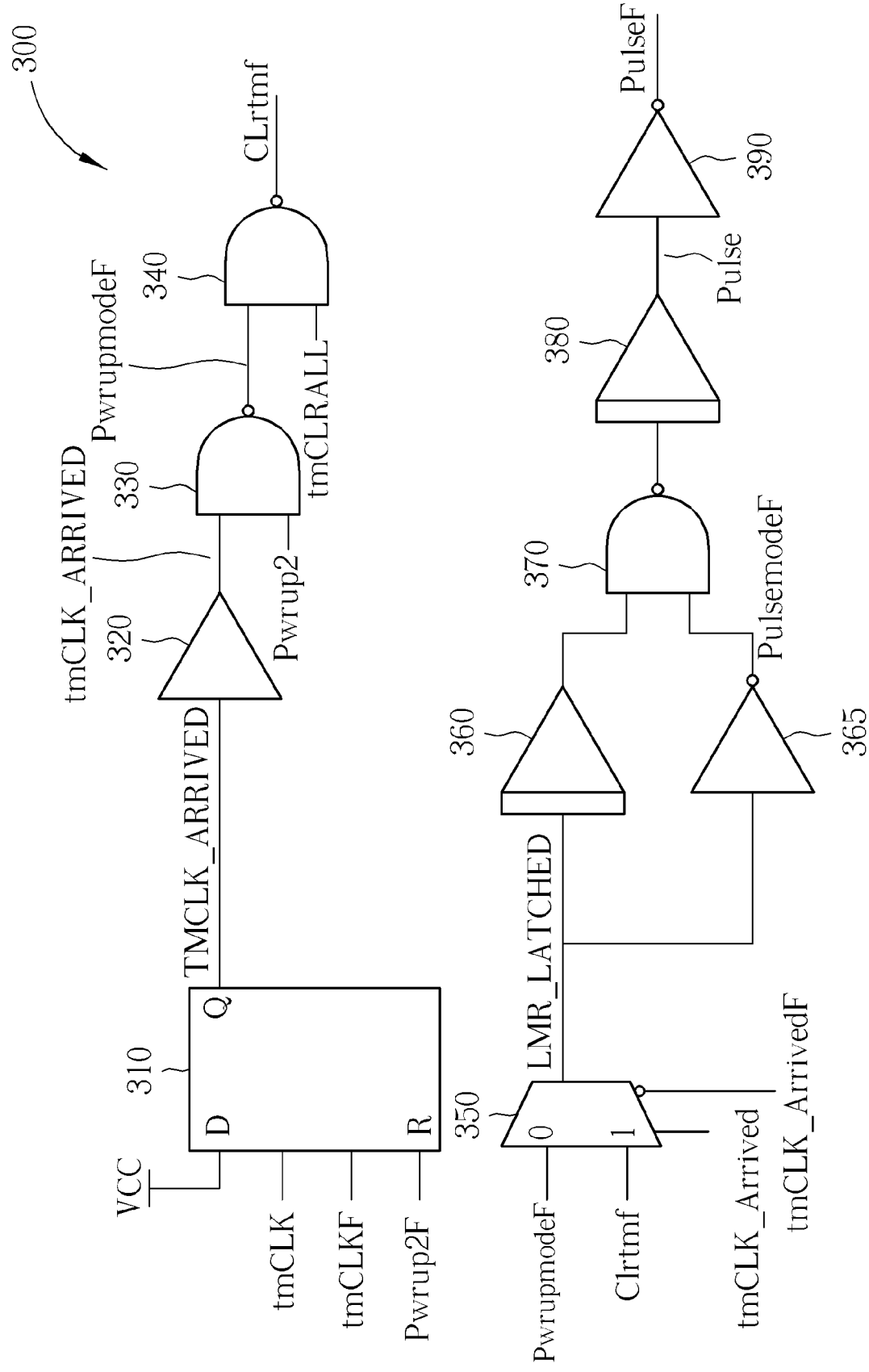

The TM block 110 receives a number of signals including a test mode clock tmCLK, as well as signals for address lines and load mode register commands. According to these inputs, the TM block 110 will generate a plurality, N, of TM signals, which are then routed via the TM send block 130 to the TM RCV block 150 as shown in FIG. 1. In addition, the TM send block 130 also receives the Load Mode Register (LMR) commands—by means of an inverter (not shown) such that the TM send block 130 receives the inverted LMR command LMRF—and tmCLK, as well as a test mode clear all signal (tmCLRALL). This tmCLRALL signal is for resetting the test mode system 100 by sending default test mode values. Conventionally, the TM send block 130 will output the test mode signals on individual wires. In the system 100 shown in FIG. 1, the TM send block 130 will generate a pulsed signal and multiplex at least two signals onto a single wire according to the timing of the pulsed signal. The means and circuitry by which the TM send block 130 multiplexes the signals will be described later and is illustrated in FIGS. 2, 3 and 4. The multiplexed TM signals are routed to the TM RCV block 150 along with the pulsed signal so that the TM RCV block 150 can latch both test mode signals received on the same wire and decode them. The pulsed signal is shown in FIG. 1 as TMCLKPULSEF.

Please refer to FIGS. 2, 3 and 4, which are schematic diagrams of the internal circuitry of the TM send block 130, and also refer to FIG. 1. The TM system 100 has three states of operation: power up mode, which occurs when the TM system 100 is powered on; TM clear mode, which occurs when default TM values are transmitted, i.e. when the tmCLRALL signal goes high; and regular mode, which occurs when the LMR commands are transmitted according to the tmCLK. At power up, a single pulse will be generated by the TM send block 130, as shown by the signal output TMCLKPULSEF output from TM send block 130 in FIG. 1. When the tmCLRALL signal goes low the regular mode can be entered, in which LMR commands are latched. The tmCLRALL signal will also intermittently go high between periods of regular mode operation in order to clear test mode values. When the tmCLRALL signal goes high a single pulse will be generated by the TM send block 130, as shown by the signal output TMCLKPULSEF output from TM send block 130 in FIG. 1. Therefore, power up mode and TM clear mode can both be referred to as Pulse mode. After the system leaves Pulse Mode and enters Regular Mode, clock pulses will be generated according to the LMR commands.

FIG. 2 shows internal circuitry of the TM send block 130 for generating the clock pulses in Regular Mode. Not shown is an inverter by means of which the LMR commands are generated from signal LMRF. The circuit 200 comprises a latch 210 which receives the signal for LMR commands and is clocked by a differential tmCLK signal. A power up signal Pwrup2F is provided to the reset input of the latch 210. Latched LMR commands, LMR_LATCHED, are output and sent to a delay block 220 and an inverter 230, and then input to a NAND gate 240. The output of the NAND gate 240, CLKF, is then passed through a second inverter 250 to generate a CLK signal. When LMR_LATCHED transitioning from a logic low to a logic high state is output by the latch 210, the delay block 220 will delay the signal and the first inverter 230 will invert the signal such that both inputs to the NAND gate 240 will be at a logic low '0,0'. Therefore, CLKF will be at a logic high state and a logic low is generated at the CLK. Once LMR_LATCHED is output by the delay block 220, the inputs of the NAND gate 240 will be '1,0', meaning CLKF will remain at a low state as the two inputs to the NAND gate 240 will be at logic high and logic low respectively. Therefore, during regular mode, clock pulses CLK are generated at the falling edge of each LMR_LATCHED signal as the output of the delay block 220 will remain at a high state while the output of the first inverter 230 will also be at a high state causing the output of the NAND gate 240 to be at a low state and the output clock CLK at a high state.

Please refer to FIG. 3. FIG. 3 is a schematic diagram of the internal circuitry 300 of the TM send block 130 for generating the clock pulses in pulse mode (i.e. power up or TM clear mode). Please note that the circuit 300 is split into two lines for clarity of illustration. Furthermore, the circuit 300 is able to generate pulses in both power up mode and TM clear mode. No signal is provided to tmCLK and no power is provided to the VCC on the input lines to latch 310 before power up in power up mode. Therefore, tmCLK_ARRIVEDF signal is at a logic high state. Pwrup2 is low as the system has not yet entered the power up state, so the output of the first NAND gate 330 is logic high. As tmCLRALL is also at a logic high state, Clrtmf output from the second NAND gate 340 will be at a logic low state. When Pwrup2 first goes to a logic high state, the tmCLK has not yet been generated, so the output of the NAND gate 330 is at a logic low state. As tmCLRALL remains high, output from the second NAND gate 340 Clrtmf will turn to a logic high state. The output of the multiplexer 350 will follow the '1' input, meaning PULSEMODEF is entered. As in the circuit 200, the signal is simultaneously input to both a delay block 360 and an inverter 365. The outputs are then sequentially passed through a NAND gate 370, a delay block 380 and an inverter 390 to generate a pulsed signal, PULSEF.

As is well known, the tmCLK will be generated at a certain amount of time after the memory device is powered up. The system 100 remains in power up mode while tmCLRALL signal stays high; however, Clrtmf will switch to logic low state when tmCLK_ARRIVED signal switches to logic high state. When tmCLRALL goes to logic low state, Clrtmf switches to logic high state again. At this time, the memory device changes to Regular Mode, and LMR commands are latched according to tmCLK, i.e. pulses are generated by the circuit 200 and Clrtmf follows tmCLRALL. As described above, the system 100 will occasionally reset all test mode values by toggling the tmCLRALL signal, and this is similar to the system 100 entering Pulse mode. Each time the tmCLRALL signal switches to a logic high state, a pulse will be generated at the falling edge of the Clrtmf signal.

Figure 4A:
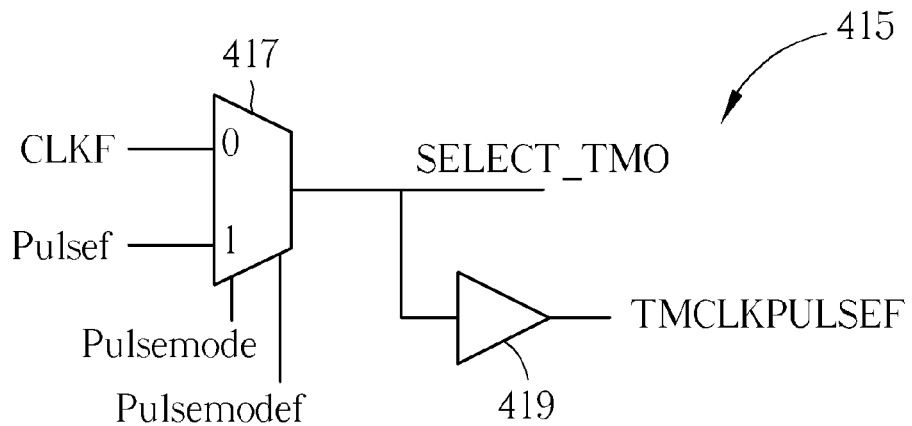
Figure 4B:
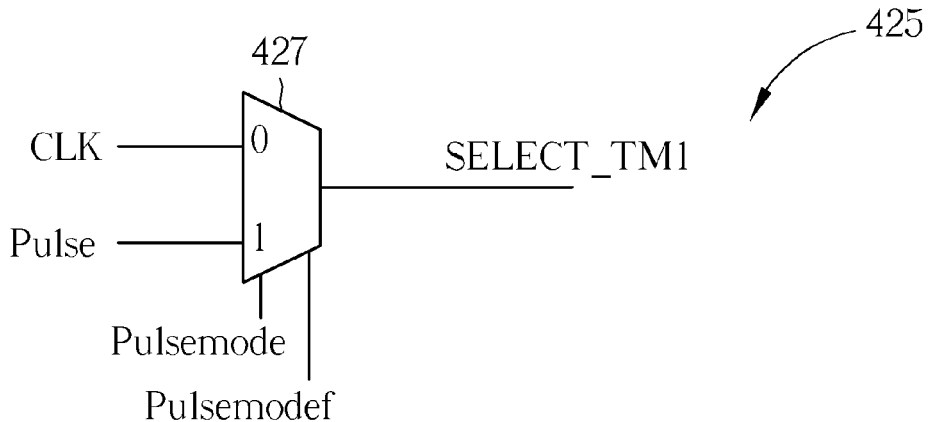

Therefore, as demonstrated by the circuit diagrams in FIGS. 2 and 3, clock pulses are generated in each mode. In addition, each circuit generates the inverse of the pulsed signal as well. Through the generation of these pulsed signals, at least two test mode signals can be multiplexed together on a single wire regardless of which mode the system is in. Please refer to FIGS. 4A, 4B and 4C. Each diagram is a schematic demonstrating how an output signal may be generated through a multiplexer. FIG. 4A is a schematic of a multiplexed circuit 415 having a multiplexer that controls selection of a first test mode signal; and FIG. 4B is a schematic of a multiplexed circuit 425 having a multiplexer 425 which controls selection of a second test mode signal. For demonstration purposes, the following description refers to test mode signals TM0 and TM1. Multiplexing of all other pairs of signals uses the same methodology as described for TM0 and TM1.

Figure 4C:
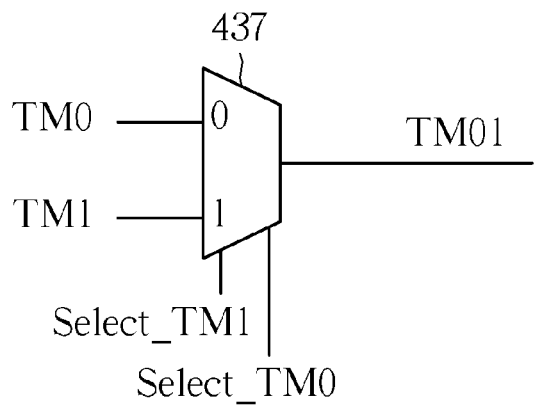

Multiplexer 415 receives an inverse clock signal CLKF output from circuit 200 and the inverse pulse signal PULSEF output from circuit 300. Signals PULSEMODE, PULSEMODEF are received as selection inputs. According to these selection signals, a pulsed signal SELECT_TM0 will be generated by multiplexer 417 wherein that pulsed signal follows CLKF in non-pulse mode, i.e., regular mode, or PULSEF in pulse mode respectively. The pulsed signal is also passed through an inverter 419 and output as TMCLKPULSEF, which is shown in FIG. 1. The multiplexed circuit 425 receives the clock signal CLK output from circuit 200 and pulse signal PULSE output from circuit 300. As in multiplexer 415, signals PULSEMODE, PULSEMODEF are received as selection inputs. According to these selection signals, a pulsed signal SELECT_TM1 will be generated by multiplexer 427 wherein the pulsed signal follows CLK in non-pulse mode, i.e., regular mode or PULSE in pulse mode respectively. Therefore, when SELECT_TM0 signal is at a high state, SELECT_TM1 will be at a low state. FIG. 4C is a schematic illustrating the final circuit of the TM send block 130, which is a multiplexer 437. Both original test mode signals, TM0 and TM1 are received from the test mode block 110, and the SELECT_TM0 and SELECT_TM1 signals are input as selection signals. Therefore, the multiplexer 437 will multiplex both test mode signals onto a single output, TM01.

Figure 5:
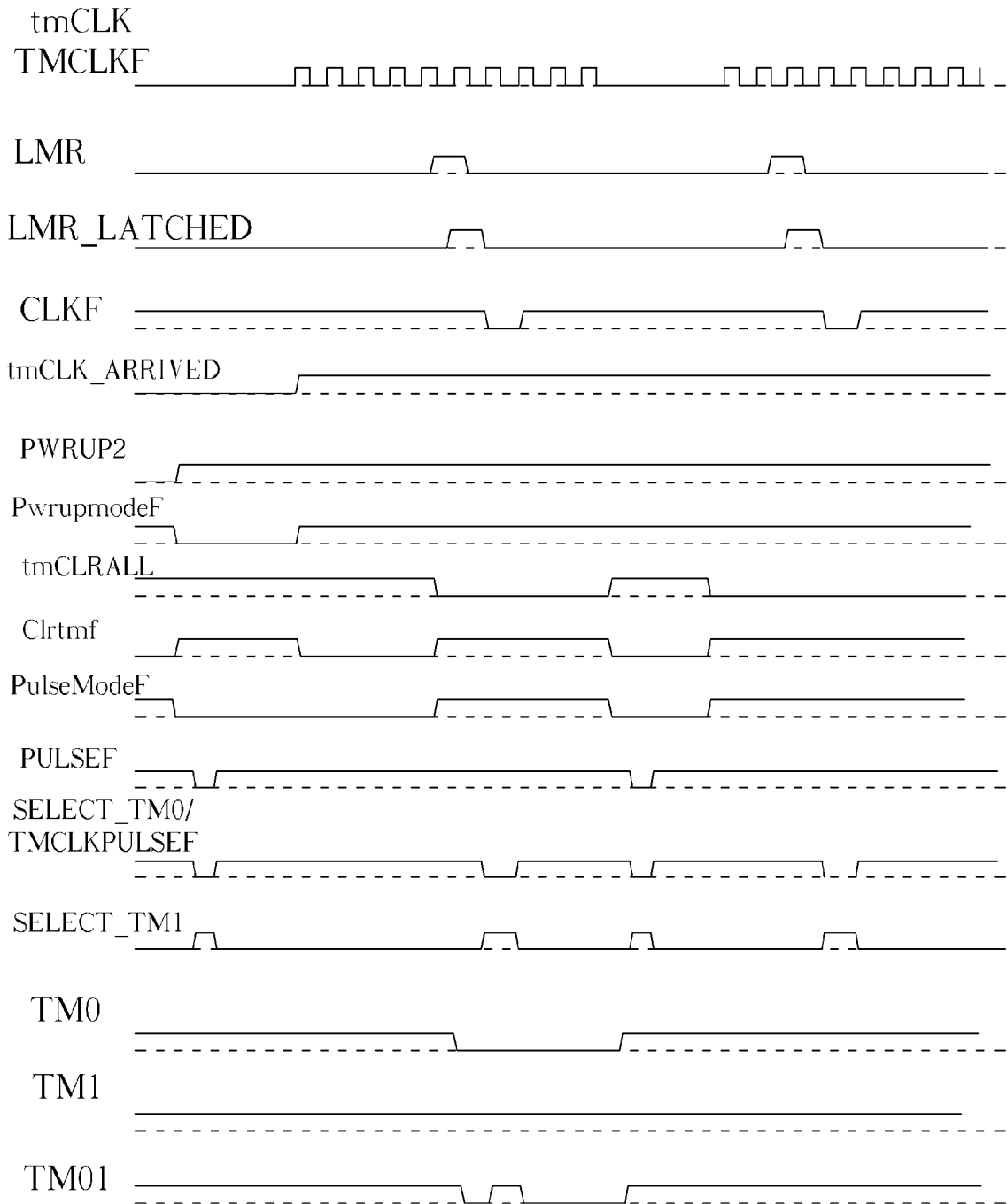
FIG. 5 is a timing diagram of the signals generated in FIGS. 2-4.

For a full illustration of the various signals generated by the internal circuitry of the TM send block, please refer to the timing diagram illustrated on FIG. 5, which is a timing diagram of the circuit that controls the generation of clock pulses for the select signals going into the multiplexer of the circuits described above. In particular, please note that PwrupmodeF switches to a logic low state when Pwrup2 is at a logic high state until tmCLK_ARRIVED is generated. Furthermore, TMCLKPULSEF is the inverse of SELECT_TM1; CLKF is generated at the falling edge of LMR_LATCHED; and PULSEF is generated at the falling edge of Clrtmf, except when PwrupmodeF goes high, when it is generated at the rising edge of Clrtmf. The remaining control signals and their respective timing should be clear to one skilled in the art after referring to FIGS. 2~4 and reading the accompanying description.

As detailed in the above paragraphs, the TM send block 130 of the present invention uses internal circuitry to generate clock pulses during all three operation modes, and uses the timing of these clock pulses to multiplex two test mode signals onto a single wire. A timing/pulsed signal TMCLK-PULSEF is output along with the multiplexed signals to the TM RCV block 150. The decoding and demultiplexing of these signals will be described below.

Figure 6:
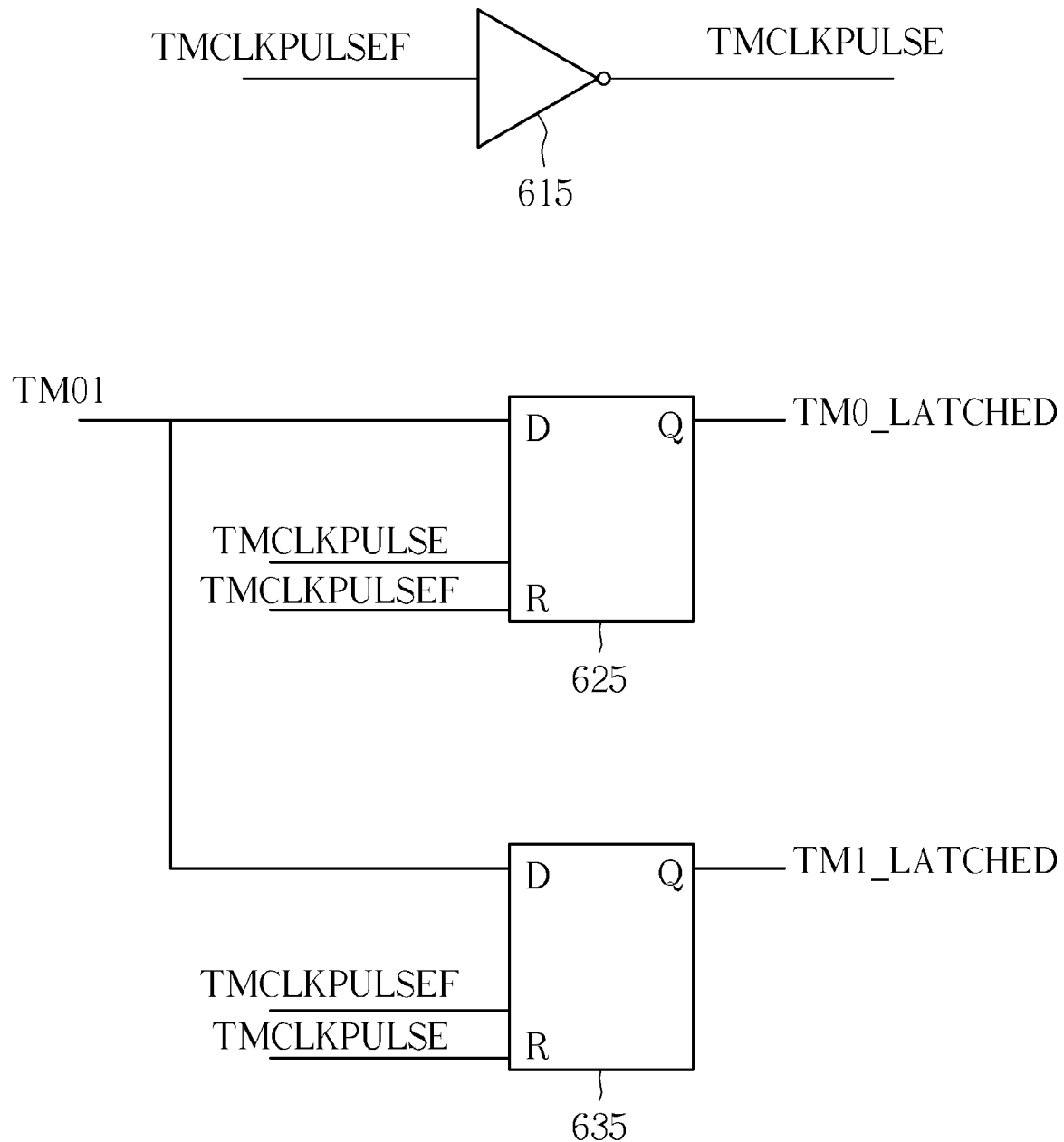
FIG. 6 is a schematic of the internal circuitry of the TM RCV block shown in FIG. 1.
Figure 7:
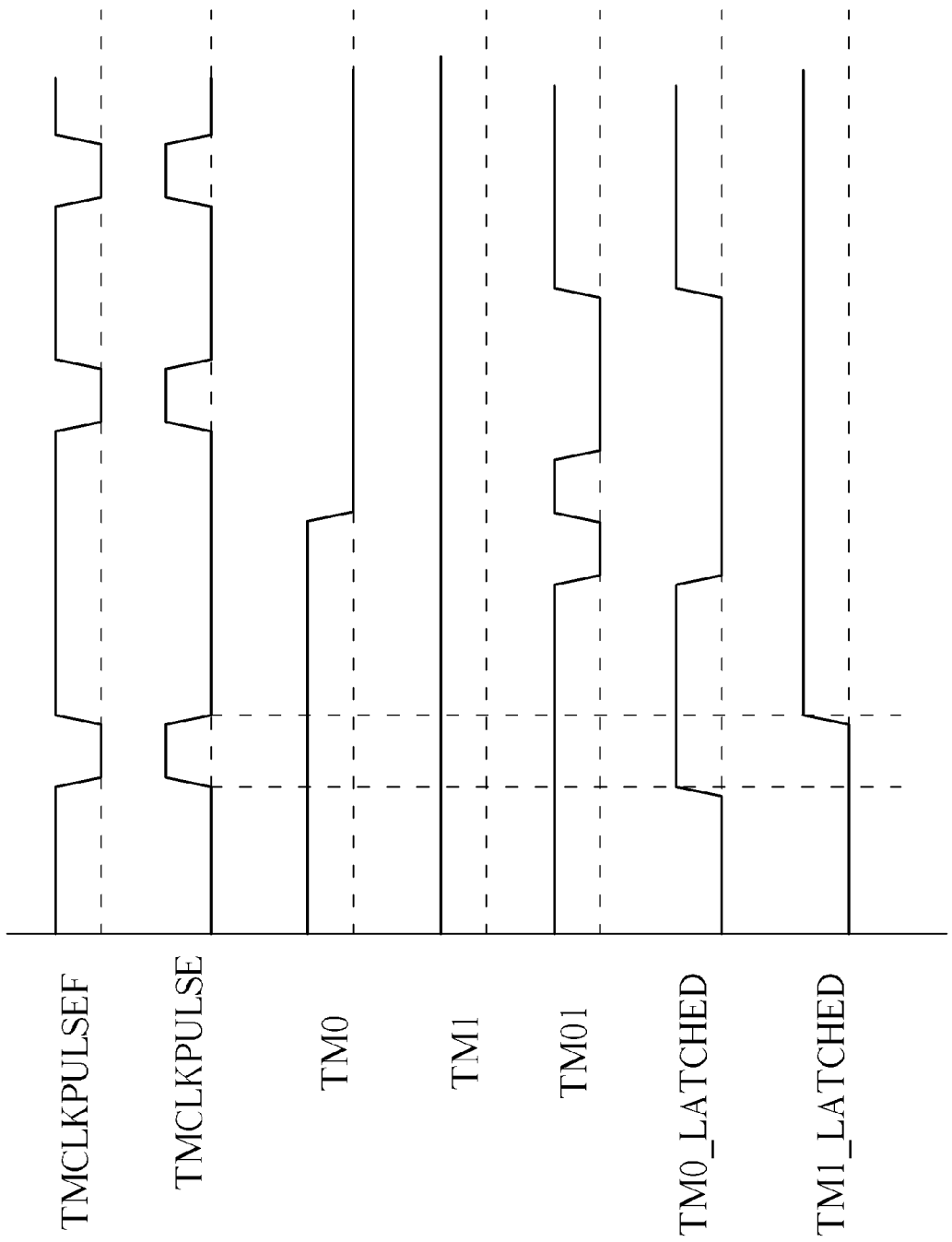
FIG. 7 is a timing diagram of the signals generated by the circuit shown in FIG. 6.

Please refer to FIG. 6, which is a block diagram of internal circuits of the TM RCV block 150. The TM RCV block 150 receives both the TM01 signal (which is the TM0 and TM1 signals multiplexed onto a single wire) and the TMCLK-PULSEF as shown in FIG. 1. The pulsed signal TMCLK-PULSEF is first input to an inverter 615 to generate TMCLK-PULSE. The multiplexed signal TM01 (as illustrated in FIG. 4C) is then input to two latches, 625 and 635. In an exemplary embodiment, latches 625 and 635 are edge-sensitive latches wherein 625 latches the signal TM0_LATCHED at the rising edge of TMCLKPULSE and 635 latches the signal TM1_LATCHED at the falling edge of TMCLKPULSE. FIG. 7 is a timing diagram of the signals received at the TM RCV block 150.

In order to ensure there is no timing issue between the TM send block and the TM RCV block, it is preferable the buffers be constructed with the same materials. The above circuitry does not require any change to the actual test mode program, as pulses are only sent according to power up and Test Clear mode, and when a TM entry occurs. Therefore, no neighbouring wires are affected. Furthermore, as the pulses only toggle according to different modes being entered, no extra power is required for the DRAM.

As mentioned above, there may be more than one TM RCV block for a single TM send block. Furthermore, in the TM send block, a MUX is required for each pair of TM signals. The control circuit only requires a single set of devices as detailed above—as each pair of signals will be multiplexed separately and decoded separately at the RCV end, the control circuit only needs to generate two selection signals, wherein these selection signals can be input to every MUX for multiplexing two signals on a single wire.

It should be noted that the internal circuitry of the TM send block as detailed in the figures and the accompanying description is merely an exemplary embodiment of the method for achieving the multiplexing of at least two test signals on a single wire. Other circuitry for achieving the above objective may be realized by those skilled in the art. Moreover, it is possible that more than two test signals are multiplexed on a single wire.

In summary, by means of multiplexers both in the TM send block and the TM RCV block and a pulsed signal generated between the two TM blocks, it is possible to mux multiple signals on a single wire and utilize the pulsed signal and the multiplexers at the receiving end for independently latching and decoding the muxed signals. In this way, circuit area for a test mode signal system is significantly reduced.

Those skilled in the art will readily observe that numerous modifications and alterations of the device and method may be made while retaining the teachings of the invention.

What is claimed is:

1. A test mode signal system, comprising:
    a test mode block operative to generate a plurality, N, of test mode signals;
    a test mode send block, for generating and outputting a pulsed signal according to a command signal, and for multiplexing the N test mode signals in sets according to the pulsed signal and outputting the multiplexed pairs of test mode signals over M signal wires wherein M is less than N, such that each signal wire carries a multiplexed set of the N test mode signals; and
    a test mode receive block, for receiving the multiplexed sets of N test mode signals and the pulsed signal and demultiplexing each multiplexed set of N test mode signals according to the pulsed signal.

2. The test mode signal system of claim 1, wherein the command signal is a test mode clear all signal for outputting default values as the N test mode signals.

3. The test mode signal system of claim 2, wherein the pulsed signal is generated once each time the test mode clear all signal goes high.

4. The test mode signal system of claim 1, wherein when a test mode clear all signal is low, the command signal is a Load Mode Register (LMR) command.

5. The test mode signal system of claim 4, wherein the pulsed signal is generated once per each Load Mode Register command.

6. The test mode signal system of claim 1, wherein the test mode send block generates an internal differential signal according to the command signal, and the internal differential signal is used for multiplexing the N test mode signals in sets and for generating the pulsed signal.

7. The test mode signal system of claim 1, wherein the test mode receive block generates an inverse of the pulsed signal and uses the resultant differential signal to demux each multiplexed set of N test mode signals.

8. The test mode signal system of claim 1, wherein M=N/2 and the test mode send block multiplexes the N test mode signals in pairs according to the pulsed signal such that each signal wire carries a multiplexed pair of the N test mode signals.

9. A method for sending test mode signals, comprising:
    receiving a command signal;
    generating and outputting a pulsed signal according to the command signal;
    generating a plurality, N, of test mode signals;
    multiplexing the N test mode signals in sets according to the pulsed signal;
    outputting the multiplexed sets of test mode signals over M signal wires wherein M is less than N, such that each signal wire carries a multiplexed set of the N test mode signals;
    receiving the multiplexed sets of N test mode signals and the pulsed signal; and
    demultiplexing each multiplexed set of N test mode signals according to the pulsed signal.

10. The method for sending test mode signals of claim 9, wherein the command signal is a test mode clear all signal for outputting default values as the N test mode signals.

11. The method for sending test mode signals of claim 10, wherein the pulsed signal is generated once each time the test mode clear all signal goes high.

12. The method for sending test mode signals of claim 9, wherein when a test mode clear all signal is low, the command signal is a Load Mode Register (LMR) command.

13. The method for sending test mode signals of claim 12, wherein the pulsed signal is generated once per each Load Mode Register command.

14. The method for sending test mode signals of claim 9, wherein the step of multiplexing the N test mode signals in sets according to the pulsed signal further comprises:
    generating an internal differential signal according to the command signal; and
    using the internal differential signal for multiplexing the N test mode signals in sets and for generating the pulsed signal.

15. The method for sending test mode signals of claim 9, wherein the step of demuxing each multiplexed set of N test mode signals according to the pulsed signal further comprises:
  generating an inverse of the pulsed signal; and
  using the resultant differential signal to demux each multiplexed set of N test mode signals.

16. The method for sending test mode signals of claim 9, wherein the step of multiplexing the N test mode signals in sets according to the pulsed signal comprises:
  multiplexing the N test mode signals in pairs;
  and the step of outputting the multiplexed sets of test mode signals over M signal wires comprises:
  outputting the multiplexed pairs of test mode signals over M signal wires where M=N/2.

* * * * *